(12) United States Patent
Ichioka et al.

(10) Patent No.: US 11,161,932 B2
(45) Date of Patent: Nov. 2, 2021

(54) RESIN COMPOSITION, RESIN FILM, SEMICONDUCTOR LAMINATE, METHOD FOR PRODUCING SEMICONDUCTOR LAMINATE AND METHOD FOR PRODUCING SEMICONDUCTOR DEVICE

(71) Applicant: SHIN-ETSU CHEMICAL CO., LTD., Tokyo (JP)

(72) Inventors: Yoichiro Ichioka, Annaka (JP); Tamotsu Oowada, Yokohama (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 24 days.

(21) Appl. No.: 16/733,046

(22) Filed: Jan. 2, 2020

(65) Prior Publication Data
US 2020/0231743 A1    Jul. 23, 2020

(30) Foreign Application Priority Data
Jan. 21, 2019    (JP) ................. JP2019-8078

(51) Int. Cl.
| C08G 59/30 | (2006.01) |
| C08G 59/24 | (2006.01) |
| C08G 59/62 | (2006.01) |
| H01L 21/56 | (2006.01) |

(52) U.S. Cl.
CPC ......... *C08G 59/306* (2013.01); *C08G 59/245* (2013.01); *C08G 59/621* (2013.01); *H01L 21/56* (2013.01)

(58) Field of Classification Search
CPC .. C08G 59/306; C08G 59/245; C08G 59/621; H01L 21/56
USPC ....................................................... 525/523
See application file for complete search history.

(56) References Cited

U.S. PATENT DOCUMENTS

| 2012/0108762 A1* | 5/2012 | Kondo | H01L 21/6836 525/476 |
| 2012/0193817 A1 | 8/2012 | Kanamaru et al. | |
| 2012/0322946 A1* | 12/2012 | Tsuchida | C09J 135/00 525/102 |
| 2013/0164653 A1* | 6/2013 | Gonon | B01D 69/148 429/492 |
| 2016/0315025 A1 | 10/2016 | Kondo et al. | |

FOREIGN PATENT DOCUMENTS

| EP | 3091048 A1 | 11/2016 | |
| JP | 2001-332662 A | 11/2001 | |
| WO | WO-2015046296 A1 * | 4/2015 | ........... G03F 7/0751 |

OTHER PUBLICATIONS

Fujiki et al., WO 2015/046296 A1 machine translation in English, Mar. 9, 2017 (Year: 2017).*
Jun. 25, 2020 Search Report issued in European Patent Application No. 20152692.8.

* cited by examiner

Primary Examiner — David T Karst
(74) Attorney, Agent, or Firm — Oliff PLC

(57) ABSTRACT

A resin composition including the following (A) to (D): (A) a resin containing epoxy groups in the range of 140 to 5000 g/eq as an epoxy equivalent; (B) a phenolic curing agent; (C) a curing accelerator; and (D) at least one compound selected among what is expressed by the following formulae (0-1) to (0-5). This provides a resin composition having small warpage and excellent adhesive force, a high adhesion resin composition film made into a film form from the composition, a semiconductor laminate having a cured product of the film and its production method, a semiconductor device obtained by dicing the semiconductor laminate into individual chips and its production method.

(0-1)

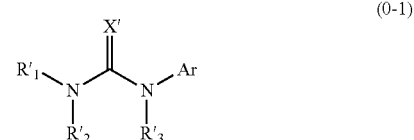

(0-2)

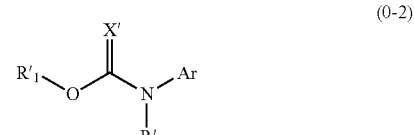

(0-3)

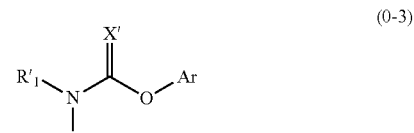

(0-4)

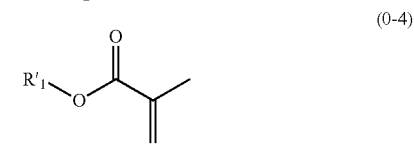

(0-5)

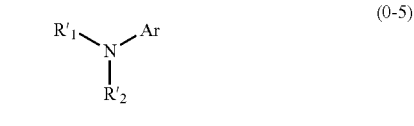

14 Claims, No Drawings

RESIN COMPOSITION, RESIN FILM, SEMICONDUCTOR LAMINATE, METHOD FOR PRODUCING SEMICONDUCTOR LAMINATE AND METHOD FOR PRODUCING SEMICONDUCTOR DEVICE

TECHNICAL FIELD

The present invention relates to a resin composition, a resin film, a semiconductor laminate, a semiconductor device, a method for producing the semiconductor laminate and a method for producing the semiconductor device.

BACKGROUND ART

In recent years, in order to respond to miniaturization, high functionality, and low cost of mobile devices such as smart-phones or the like in a semiconductor industry, thinning of a silicon wafer to be a chip substrate, conversion to a large scale CCL substrate or a BT substrate to intend to improve a production efficiency have been forwarded. However, in a thin substrate, a large scale CCL substrate or a BT substrate, since warpage becomes remarkable, a large load is applied on a sealing material, and peeling from an adhesion surface tends to occur, the adhesion strength of the sealing material becomes more and more important. In order to improve the adhesion strength, although various studies have been tried, a sealing material having further high adhesion is demanded (Patent Document 1).

Furthermore, in order to improve the production efficiency, the CCL or BT substrate is frequently used as a square substrate. However, when these materials are sealed, in a liquid sealant, the irregularity tends to occur inside and outside of the substrate. Therefore, a film type sealant that can readily uniformly seal these has been desired.

There, development of a high adhesion resin composition difficult to be peeled even during the warpage, and a wafer mold material having excellent wafer protective performance with this, and making it into a film form has been desired.

CITATION LIST

Patent Document

Patent Document 1: Japanese Patent Laid-Open Publication No. 2001-332662

SUMMARY OF INVENTION

Technical Problem

The present invention has been carried out in view of the above problems and intend to provide a resin composition having small warpage and an excellent adhesive force, a high adhesion resin composition film formed into a film from the composition, a semiconductor laminate having a cured matter of the film and its production method, and a semiconductor device obtained by dicing the semiconductor laminate into chips and its production method.

Solution to Problem

To achieve the above object, the present invention provides a resin composition including the following (A) to (D):
(A) a resin containing epoxy groups in the range of 140 to 5000 g/eq as an epoxy equivalent,
(B) a phenolic curing agent,
(C) a curing accelerator, and
(D) at least one compound selected among what is expressed by the following formulae (0-1) to (0-5)

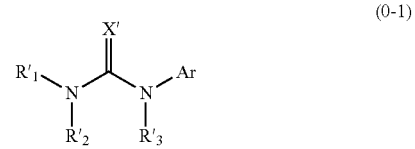

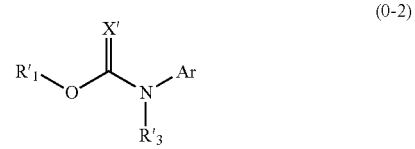

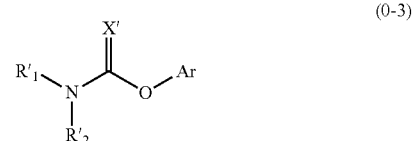

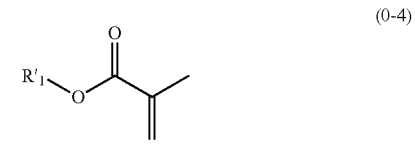

wherein $R'_1$ represents a monovalent organic group having 1 to 20 carbon atoms containing a hydrolyzable silyl group, $R'_2$, $R'_3$ each represents a hydrogen atom or a monovalent organic group having 1 to 20 carbon atoms, X' represents an oxygen atom or a sulfur atom, and Ar represents an aromatic ring or a heterocyclic ring, optionally having two substitution groups.

The composition like this has small warpage and excellent adhesive force.

The resin composition may further contain 0.1 to 80 parts by mass of (E) an epoxy compound other than the component (A) based on 100 parts by mass of the component (A).

The resin composition like this has smaller warpage and more excellent adhesive force.

The resin composition may further contain (F) an inorganic filler.

The resin composition like this may, by containing the inorganic filler, provide more preferable wafer protection, furthermore, improve heat resistance, humidity resistance, and strength, and may improve the reliability of a cured product.

Furthermore, the (F) inorganic filler is silica, and is contained by 20 to 96 mass % in the resin composition.

The resin composition like this may further improve the reliability of the cured product.

Furthermore, in the compounds expressed by the general formula (0-1) to formula (0-3), X' may be an oxygen atom.

The compound like this is further preferable from the viewpoint of availability of a raw material, or preservation stability of the composition.

Furthermore, the component (A) is preferable to be a silicone-modified epoxy resin.

By using the resin like this, the flexibility is imparted to the resin composition before curing, forming into a film is made easy, furthermore, after curing, sufficient elastic modulus may be shown.

Furthermore, it is preferable that the silicone-modified epoxy resin contains a structural unit expressed by the following formula (4) and has a weight average molecular weight of 3,000 to 500,000:

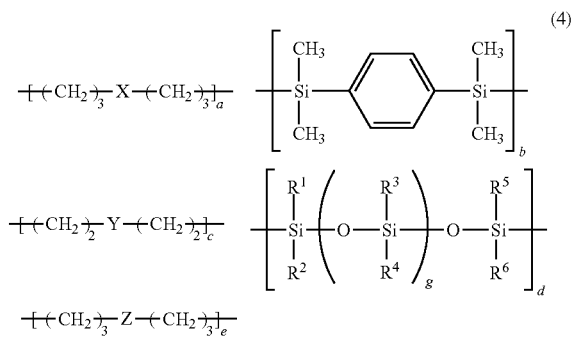

in the formula, $R^1$ to $R^6$ each is independently a monovalent hydrocarbon group or an alkoxy group having 1 to 20 carbon atoms, and may be the same with or different from each other; furthermore, "a", "b", "c", "d" and "e" express a composition ratio of each repeating unit and are numbers satisfying $0<a<1$, $0 \leq b<1$, $0 \leq c<1$, $0<d<1$, $0 \leq e<1$, $0.67 \leq (b+d)/(a+c+e) \leq 1.67$, and $a+b+c+d+e=1$; "g" is an integer of 0 to 300; X is a divalent organic group expressed by the following formula (5); Y is a divalent siloxane skeleton-containing group expressed by the following formula (6); Z is a divalent organic group expressed by the following formula (7);

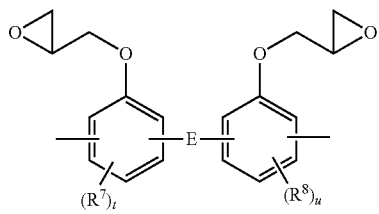

wherein E is a single bond, or a divalent organic group selected from the following formulae,

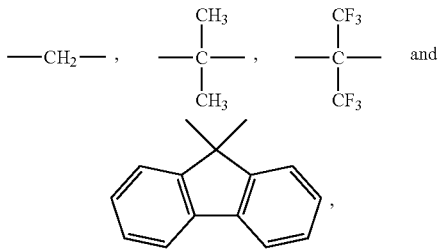

$R^7$ and $R^8$ are a monovalent hydrocarbon group or an alkoxy group having 1 to 20 carbon atoms and may be the same with or different from each other; "t" and "u" each is independently an integer of 0 to 2;

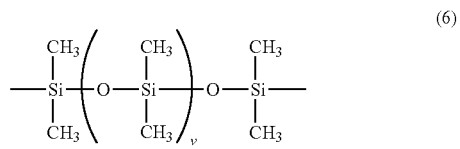

wherein "v" is an integer of 0 to 300;

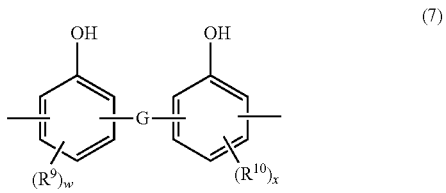

wherein G is a single bond or a divalent organic group selected from the following formulae,

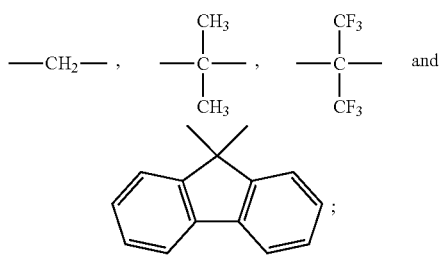

$R^9$ and $R^{10}$ each is a monovalent hydrocarbon group or an alkoxy group having 1 to 20 carbon atoms, and may be the same with or different from each other; "w" and "x" each is independently an integer of 0 to 2.

When the resin like this is used, more flexibility is given to the resin composition before curing, forming into a film is made easy, furthermore, after curing, more excellent elastic modulus may be exhibited.

Furthermore, the present invention provides a resin film formed into a film from the resin composition.

Since the resin film like this has high adhesion force, a semiconductor wafer may be sufficiently protected thereby.

Furthermore, the present invention provides a semiconductor laminate having a cured product of the resin film on a semiconductor wafer.

Since the semiconductor laminate like this has a high adhesive force of a resin film, the semiconductor wafer may be sufficiently protected with the resin film.

Furthermore, the present invention provides semiconductor devices in which the semiconductor laminate is diced into individual chips.

The semiconductor device like this has high quality.

Furthermore, the present invention provides a method for producing the semiconductor laminate, the method for producing the semiconductor laminate including: a step of adhering the resin film on the semiconductor wafer and molding the semiconductor wafer; and a step of curing the resin film by heating.

The method for producing the semiconductor laminate like this may produce a semiconductor laminate in which the semiconductor wafer is sufficiently protected with the resin film.

Furthermore, the present invention is a method for producing the semiconductor devices, the method for producing the semiconductor devices including a step of dicing the semiconductor laminate produced by the method for producing the semiconductor laminate into individual chips.

The method for producing the semiconductor devices like this may produce semiconductor devices having high quality.

Advantageous Effects of Invention

Since the resin composition of the present invention gives a film that may largely improve the adhesive force of a cured product, has excellent low warpage and may mold collectively the wafer, the resin composition may be suitably used in a wafer level package. By using these inventions, high quality semiconductor devices may be provided with a high yield.

DESCRIPTION OF EMBODIMENTS

As was described above, a resin composition giving a film having small warpage and excellent adhesive force, a high strength resin film formed into a film from the composition, a semiconductor laminate that has a cured product of the resin film and its production method, and semiconductor devices obtained by dicing the semiconductor laminate into individual chips and its production method are demanded.

The present inventers have studied hard to achieve the above object. As a result, the present inventers have found that when (A) a resin containing epoxy groups in the range of 140 to 5000 g/eq as an epoxy equivalent, (B) a phenolic curing agent, (C) a curing accelerator, and (D) a compound having a specific structure are combined, a resin composition giving a film having high adhesive force and small warpage could be obtained. Furthermore, it was found that a wafer molding material capable of readily handling is formed by making the resin composition into a film, and the present invention was completed.

That is, the present invention is a resin composition containing the following (A) to (D):
(A) a resin containing epoxy groups in the range of 140 to 5000 g/eq as an epoxy equivalent,
(B) a phenolic curing agent,
(C) a curing accelerator, and
(D) at least one compound selected among what is expressed by the following formulae (0-1) to (0-5)

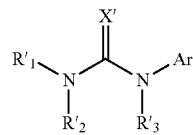

(0-1)

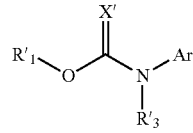

(0-2)

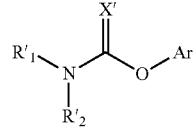

(0-3)

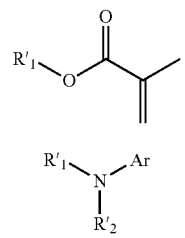

(0-4)

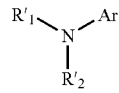

(0-5)

wherein $R'_1$ represents a monovalent organic group having 1 to 20 carbon atoms containing a hydrolyzable silyl group, $R'_2$, $R'_3$ each represents a hydrogen atom or a monovalent organic group having 1 to 20 carbon atoms, X' represents an oxygen atom, or a sulfur atom, and Ar represents an aromatic ring or a hetero ring that may have two substitution groups.

Incidentally, at least one compound selected among the above-described formulae (0-1) to (0-5) is hereinafter referred to as also an "adhesive aide".

In what follows, the present invention will be detailed, but the present invention is not limited to these.
[Resin Composition]

The resin composition of the present invention includes the following components (A) to (D):
(A) a resin containing epoxy groups in the range of 140 to 5000 g/eq as an epoxy equivalent,
(B) a phenolic curing agent,
(C) a curing accelerator, and
(D) an adhesive aide.

In what follows, each of the components will be detailed.
[Component (A)]

The component (A) is a resin containing epoxy groups in the range of 140 to 5000 g/eq as an epoxy equivalent (Hereinafter, referred to also as an "epoxy resin").

As the resin (epoxy resin), a bisphenol A type epoxy resin, a bisphenol F type epoxy resin, a bisphenol AD type epoxy resin, a phenol novolak type epoxy resin, a biphenyl type epoxy resin, a naphthalene type epoxy resin, an alicyclic epoxy resin, a glycidyl ester type epoxy resin, a glycidyl amine type epoxy resin, a heterocyclic epoxy resin, a diaryl sulfone type epoxy resin, and a silicone-modified epoxy resin may be used, but are not limited to these. When the component (A) is solid at room temperature, it is easy to form into a film. In the case of the solid, in addition to be easy to mold into a film, a cover film is also readily peeled. Furthermore, an epoxy resin containing epoxy groups in the range of 140 to 5000 g/eq as an epoxy equivalent can be sufficiently crosslinked to be able to impart the chemical resistance or the adhesive force to a cured product. When the epoxy groups are contained less than this, the curing becomes insufficient to be poor in the chemical resistance or to deteriorate the adhesive force, and when the epoxy groups are contained more than this, the warpage tends to be larger.

Incidentally, the epoxy equivalent (g/eq) is calculated by dividing an amount of the resin (g) by an equivalent (eq) of the epoxy groups contained in the resin. The measurement of the epoxy equivalent is performed according to JIS K 7236.

The component (A) is preferable to be a silicone-modified epoxy resin. When the silicone-modified epoxy resin is used, the flexibility of the composition increases to facilitate forming into a film.

Furthermore, it is preferable that the silicone-modified epoxy resin has a structural unit expressed by the following formula (4) and the weight-average molecular weight of 3,000 to 500,000.

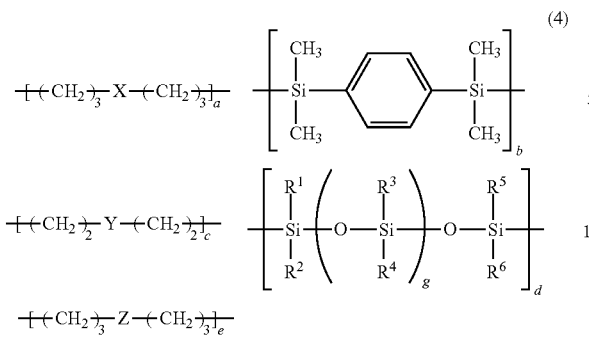
(4)

In the formula, $R^1$ to $R^6$ each is independently a monovalent hydrocarbon group or an alkoxy group having 1 to 20 carbon atoms, and may be the same with or different from each other; furthermore, "a", "b", "c", "d" and "e" express a composition ratio of each repeating unit and are numbers satisfying $0<a<1$, $0\leq b<1$, $0\leq c<1$, $0<d<1$, $0\leq e<1$, $0.67\leq(b+d)/(a+c+e)\leq1.67$, and $a+b+c+d+e=1$; "g" is an integer of 0 to 300; X is a divalent organic group expressed by the following formula (5); Y is a divalent siloxane skeleton-containing group expressed by the following formula (6); Z is a divalent organic group expressed by the following formula (7);

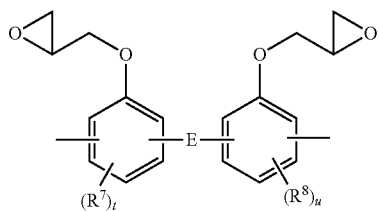
(5)

wherein E is a single bond or a divalent organic group selected from the following formulae,

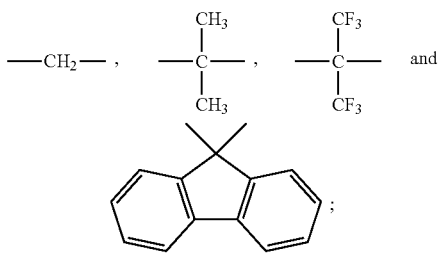

$R^7$ and $R^8$ are a monovalent hydrocarbon group or an alkoxy group having 1 to 20 carbon atoms, and may be the same with or different from each other; and "t" and "u" each is independent from each other, and an integer of 0 to 2.

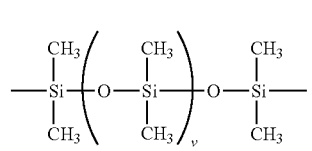
(6)

Wherein "v" is an integer of 0 to 300;

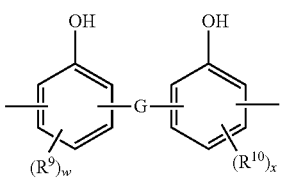
(7)

wherein G is a single bond or a divalent organic group selected from the following formulae,

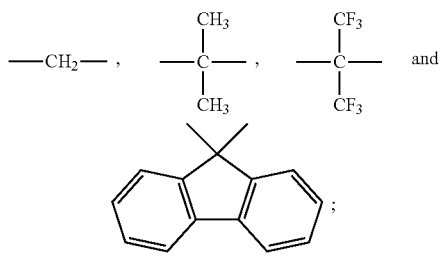

$R^9$ and $R^{10}$ are a monovalent hydrocarbon group or an alkoxy group having 1 to 20 carbon atoms, and may be the same with or different from each other; "w" and "x" each is independently an integer of 0 to 2.

$R^1$ to $R^6$ each is independently a monovalent hydrocarbon group or alkoxy group having 1 to 20 carbon atoms, and may be the same with or different from each other; furthermore, "a", "b", "c", "d" and "e" express a composition ratio of each repeating unit and are numbers satisfying $0<a<1$, $0\leq b<1$, $0\leq c<1$, $0<d<1$, $0\leq e<1$, $0.67\leq(b+d)/(a+c+e)\leq1.67$, and $a+b+c+d+e=1$.

As the monovalent hydrocarbon groups having 1 to 20 carbon atoms, for example, alkyl groups, cycloalkyl groups, and aryl groups having 1 to 20 carbon atoms are cited, for example, a methyl group, an ethyl group, a propyl group, a hexyl group, a cyclohexyl group, and a phenyl group are exemplified. Among these, the methyl group and phenyl group are preferable from the viewpoint of easy availability of raw materials. As the alkoxy group, a group in which an oxygen atom is bonded to the monovalent hydrocarbon group, for example, a methoxy group, an ethoxy group, a propoxy group and a phenoxy group are exemplified. "a" to "e" are not particularly limited as far as the above conditions are satisfied.

In the formulae (5) and (7), $R^7$, $R^8$, $R^9$ and $R^{10}$ are a monovalent hydrocarbon group or an alkoxy group having 1 to 20 carbon atoms, and may be the same with or different from each other. As the $R^7$ to $R^{10}$, an alkyl group or an alkoxy group having preferably 1 to 4 carbon atoms, more preferably 1 to 2 carbon atoms, specifically, a methyl group, an ethyl group, a propyl group, a tert-butyl group, a methoxy group and an ethoxy group are preferably used.

In the formulae (5) and (7), "t", "u", "w" and "x" each is preferable to be independently an integer of 0 to 2.

A weight-average molecular weight (Mw) of the silicone-modified epoxy resin expressed by the formula (4) is 3,000 to 500,000, and preferably 5,000 to 200,000. The silicone-modified epoxy resin expressed by the formula (4) may be a random copolymer or a block copolymer.

The epoxy resin may be used singularly or used in a combination of two or more kinds.

The silicone-modified epoxy resin expressed by the formula (4) may be produced according to a method shown below by using a compound selected from a silphenylene compound expressed by the following formula (8) and compounds expressed by the following formulae (9) to (12).

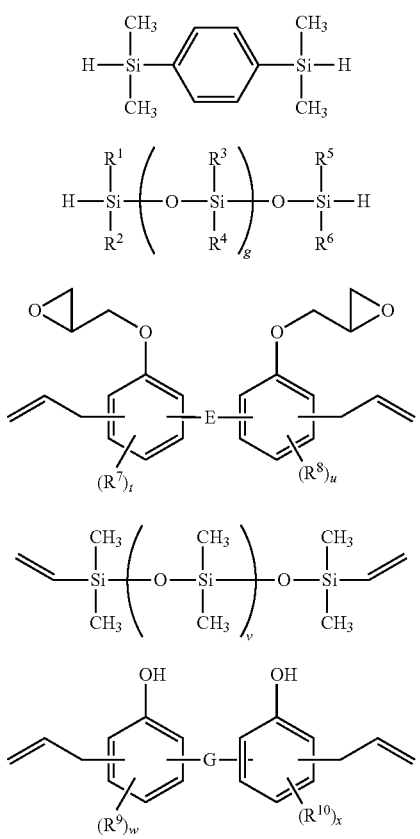

Wherein $R^1$ to $R^{10}$, E, G, "g", "t", "w" and "x" are the same as before.

The silicone-modified epoxy resin expressed by the formula (4) may be synthesized by hydrosilylating a raw material. At this time, a reaction may be performed in a state where all raw materials are charged in a reaction vessel, or a part of the raw materials may be reacted in advance followed by making a residue of the raw materials react, or raw materials may be reacted one kind by one kind, or an order to be reacted is optionally selected. The respective compounds are preferably compounded such that a total of number of moles of hydrosilyl groups which compounds expressed by the above formulae (8) and (9) contain to a total of number of moles of alkenyl groups which compounds expressed by the above formula (10), (11) and (12) contain is 0.67 to 1.67, preferably 0.83 to 1.25.

This polymerization reaction is performed under the presence of a catalyst. The catalyst that is widely known to promote the hydrosilylation may be used. Specifically, a palladium complex, a rhodium complex, or a platinum complex may be used, without limiting to these. The catalyst is preferably added by about 0.01 to 10.0 mole % relative to a Si—H bond. In the case of 0.01 mole % or larger, the reaction proceeds sufficiently without delaying the progress of the reaction, and in the case of 10.0 mole % or smaller, a dehydrogenation reaction tends to be difficult to proceed to be free from fear of disturbing the progress of an addition reaction.

As a solvent used in the polymerization reaction, an organic solvent that does not disturb the hydrosilylation may be widely used. Specific examples include octane, toluene, tetrahydrofuran, and dioxane without limiting to these. The solvent is preferably used such that a solute may be 10 to 70 mass %. In the case of 10 mass % or larger, a reaction system does not become thin, and the progress of the reaction does not become slow. Furthermore, in the case of 70 mass % or smaller, the viscosity does not become high, and there is no fear of becoming incapable of sufficiently stirring the system during the reaction.

The reaction is usually performed at a temperature of 40 to 150° C., preferably at a temperature of 60 to 120° C., and particularly preferably at a temperature of 70 to 100° C. When the reaction temperature is 150° C. or lower, a side reaction such as decomposition becomes difficult to occur, and when the reaction temperature is 40° C. or higher, a progress of the reaction does not become slow. Furthermore, a reaction time is usually 0.5 to 60 hours, preferably 3 to 24 hours, and particularly preferably 5 to 12 hours.

By using the resin like this, the flexibility is imparted to the resin composition before curing to make easier to form into a film, furthermore, after the curing, sufficient elastic modulus is given, and cured products having excellent chemical resistance, heat resistance, pressure resistance other than the above may be provided.

[Component (B)]

As a phenolic curing agent of the component (B), known ones may be widely usable. As a structure of the curing agent, a polyalcohol having 2 to 10 OH groups is preferred, and what is shown below may be illustrated without limiting these.

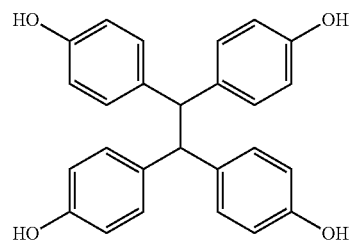

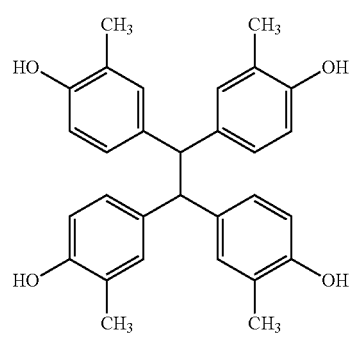

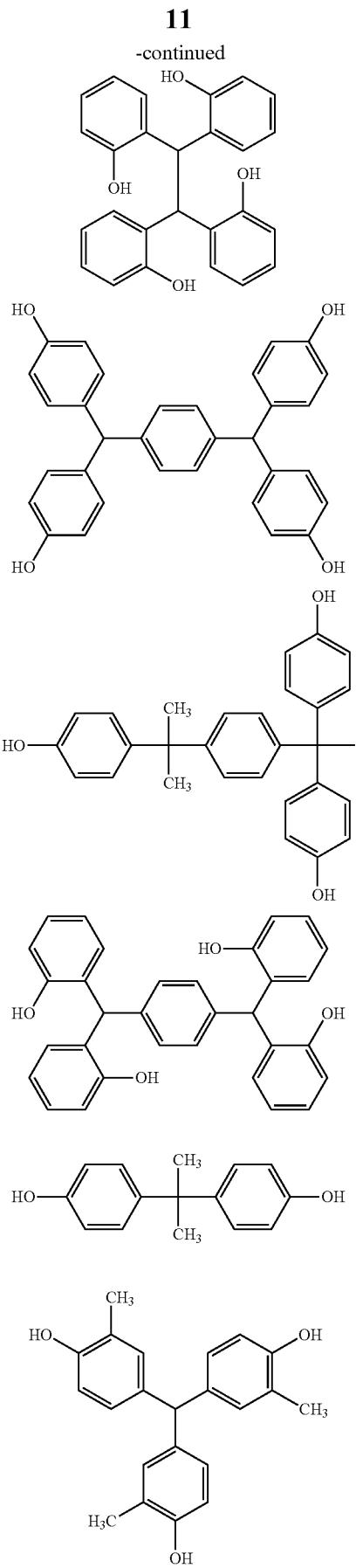

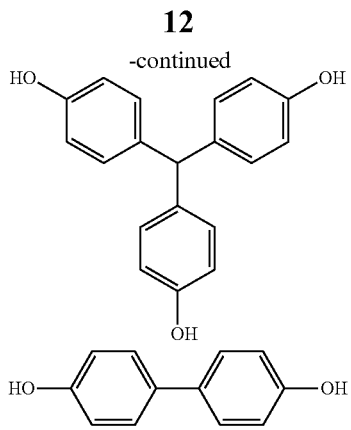

A content of the component (B) is preferably compounded such that a phenolic hydroxyl group equivalent in the component (B) is 60 mole % to 140 mole %, and more preferably 90 mole % to 110 mole % relative to epoxy equivalent in the composition. In the case of the above range, a curing reaction proceeds excellently, epoxy groups or phenol groups do not remain excessively to be difficult to deteriorate the reliability.

[Component (C)]

As a curing accelerator of the component (C), what is used in ring-opening of the epoxy group may be widely used. Examples of the curing accelerator include: imidazoles such as imidazole, 2-methylimidazole, 2-ethylimidazole, 2-heptadecylimidazole, 1,2-dimethylimidazole, 2-ethyl-4-methylimidazole, 2-undecylimidazole, 2-phenylimidazole, 2-phenyl-4-methylimidazole, 1-benzil-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 2-phenyl-4,5-dihydroxymethylimidazole, and 2-phenyl-4-methyl-5-hydroxymethylimidazole; tertiary amines such as 2-ethyl-4-methylimidazole 2-(dimethylaminomethyl)phenol, triethylene diamine, triethanolamine, 1,8-diazabicyclo [5.4.0]undecene-7, and tris(dimethylaminomethyl)phenol; organic phosphines such as diphenylphosphine, triphenylphosphine and tributylphosphine; tetra-substituted phosphonium/tetra-substituted borate such as tetraphenylphosphonium/tetraphenyl borate and tetraphenylphosphonium/ethyltriphenyl borate; and metal compounds such as tin oxalate.

A content of the component (C) is preferably 0.01 to 20.0 parts by mass, more preferably 0.1 to 5.0 parts by mass relative to 100 parts by mass of the component (A). In the range described above, the curing reaction proceeds just the right amount, the cured product does not become fragile, and the reliability is improved.

[Component (D)]

The component (D) is a necessary component of the present invention, and an effective component (adhesive aide) to improve the adhesive force. The component (D) is at least one compound selected among ones shown by the following formulae (0-1) to (0-5).

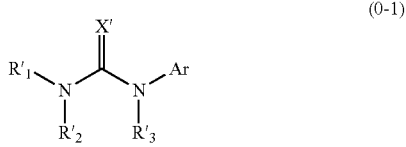

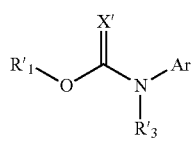

(0-2)

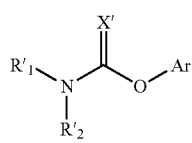

(0-3)

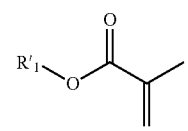

(0-4)

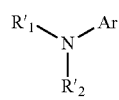

(0-5)

$R'_1$ represents a monovalent organic group having 1 to 20 carbon atoms containing a hydrolyzable silyl group, $R'_2$, $R'_3$ each represents a hydrogen atom or a monovalent organic group having 1 to 20 carbon atoms, X' represents an oxygen atom or a sulfur atom, and Ar represents an aromatic ring or a heterocyclic ring that may have two substituents.

$R'_1$ is a monovalent organic group having 1 to 20 carbon atoms containing a hydrolyzable silyl group. The organic group may be a hydrocarbon group having a hydrolyzable silyl group. Examples of the hydrolyzable silyl groups include: an alkoxy silyl group, an acyl oxysilyl group, an alkenyl oxysilyl group, an aryloxysilyl group, a halogenated silyl group, and a silyl group having an amide group, an amino group, an aminoxy group, or a ketoximate group. Examples of hydrocarbon groups include: alkylene groups such as a methylene group, an ethylene group, a propylene group, a butylene group, a pentamethylene group, a hexamethylene group, a heptamethylene group, an octamethylene group, a nonamethylene group and a decamethylene group; arylene groups such as a phenylene group, and a naphthylene group; and aralkylene groups such as a phenethylene group, and a xylylene group. As the alkoxy group in the alkoxysilyl group, for example, a methoxy group, an ethoxy group, a propoxy group, and a phenoxy group may be exemplified.

$R'_2$, $R'_3$ each is a hydrogen atom or a monovalent organic group having 1 to 20 carbon atoms. Examples of the monovalent organic group having 1 to 20 carbon atoms include: alkyl groups such as a methyl group, an ethyl group, a propyl group, a butyl group, a pentyl group, a hexyl group and a cyclohexyl group; aryl groups such as a phenyl group and a naphthyl group; and aralkyl groups such as a phenethyl group.

The Ar is an aromatic ring or a heterocyclic ring that may have two substituents. For example, a phenyl group, a tolyl group, a xylyl group, a naphthyl group, a pyridyl group, a quinolyl group, a pyrrolyl group, an imidazolyl group, and a pyrimidyl group may be exemplified.

X' is an oxygen atom or a sulfur atom. In the compounds expressed by the general formulae (0-1) to (0-3), the X' is preferably an oxygen atom from the viewpoint of easy availability of the raw materials and the storage stability of the composition.

As the component (D) (adhesive aide), for example, the following compounds may be used.

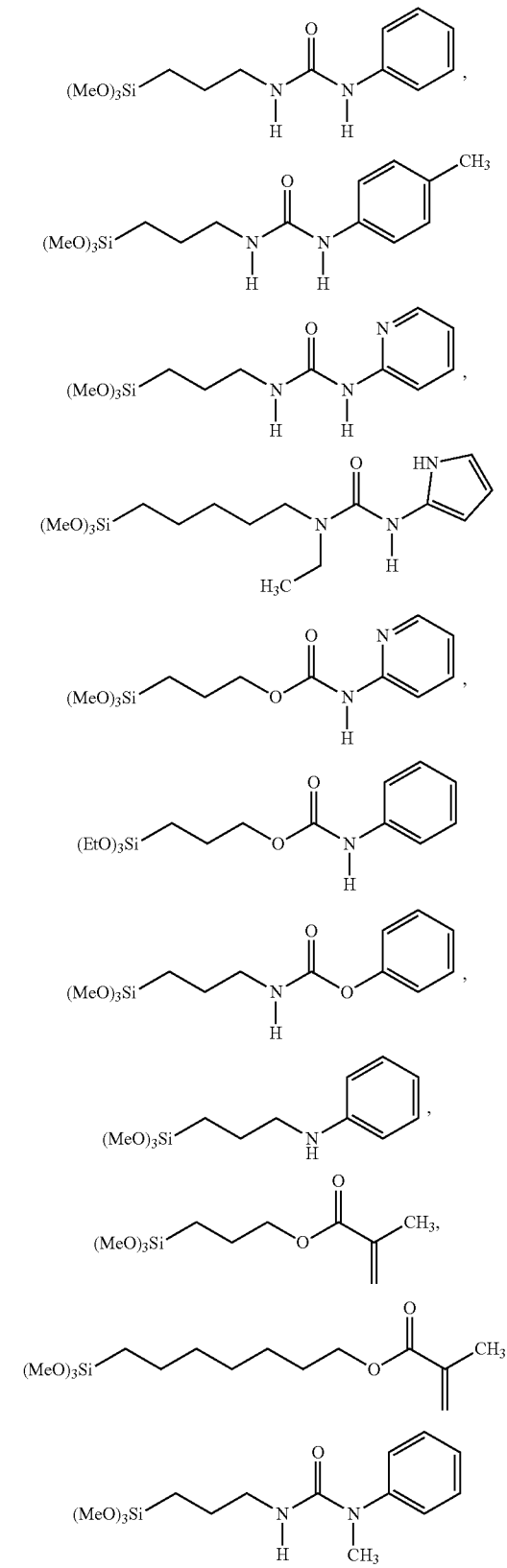

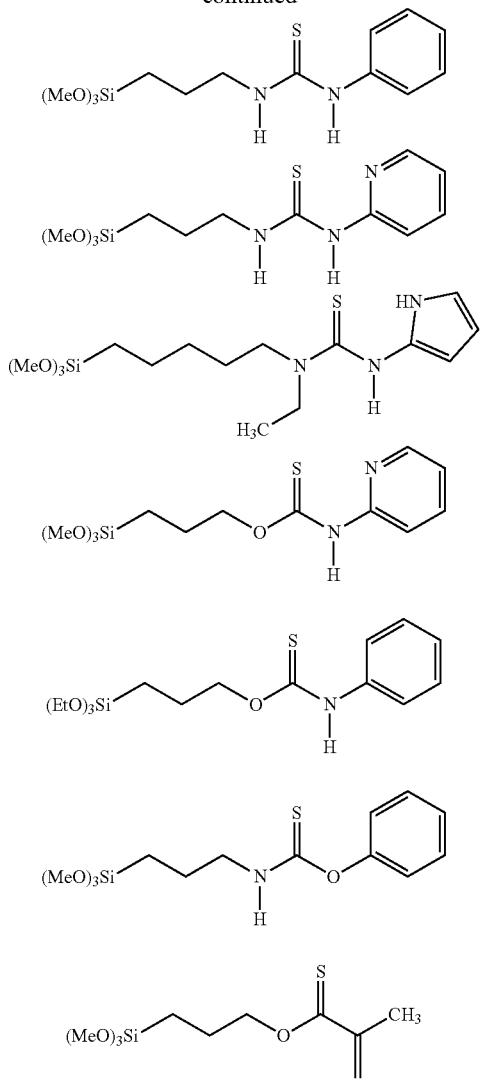

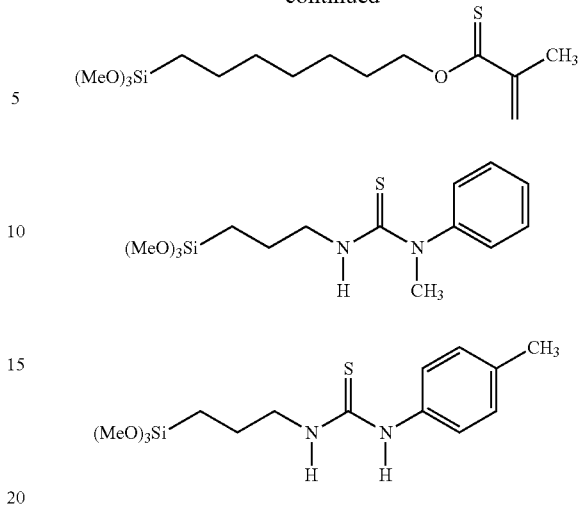

The component (D) is preferably 0.1 to 40 parts by mass, and more preferably 1.0 to 15 parts by mass relative to 100 parts by mass of the component (A). In this range, the curing reaction is not disturbed and the adhesive force is improved. The component (D) may be used singularly or may be used in a combination of two or more kinds.

[Component (E)]

Furthermore, in the resin composition, an epoxy resin (E) other than the component (A) may be added. When adding the (E), the (E) is added in the range of 0.1 to 80 parts by mass, preferably 0.5 to 50 parts by mass, and more preferably 1 to 30 parts by mass relative to 100 parts by mass of the epoxy group-containing resin of the component (A). In the case of this range, an effect of the epoxy resin is exhibited and the warpage amount does not increase.

The epoxy compound (E) has 2 to 10 epoxy groups, preferably 2 to 5 epoxy groups in the compound, and what is shown below is illustrated, but is not limited to these. The epoxy compound (E) may be used singularly, or may be used in two kinds or more.

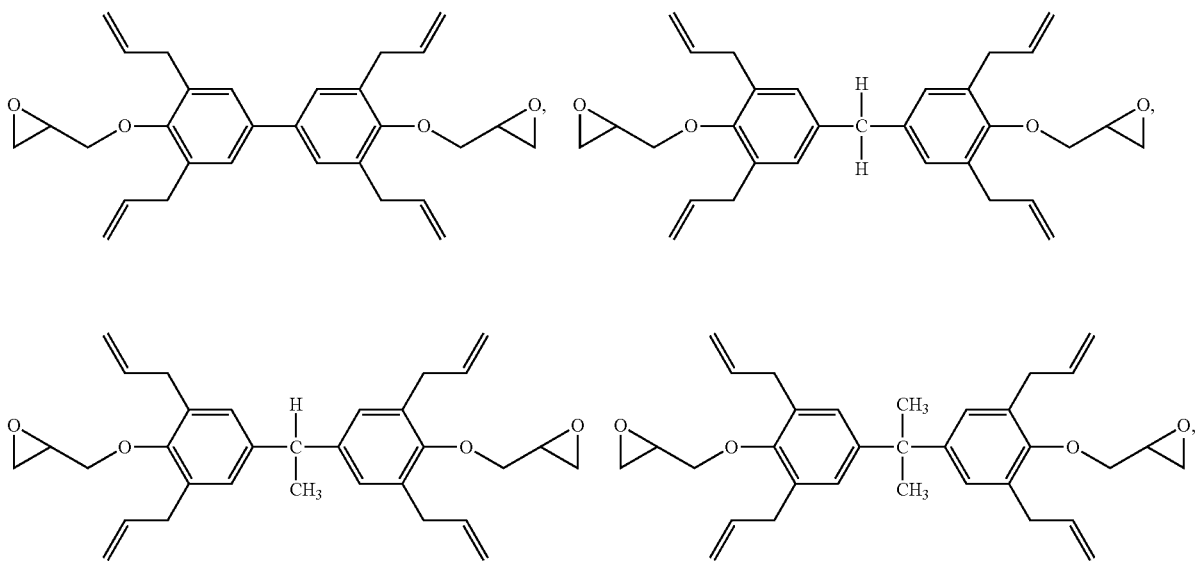

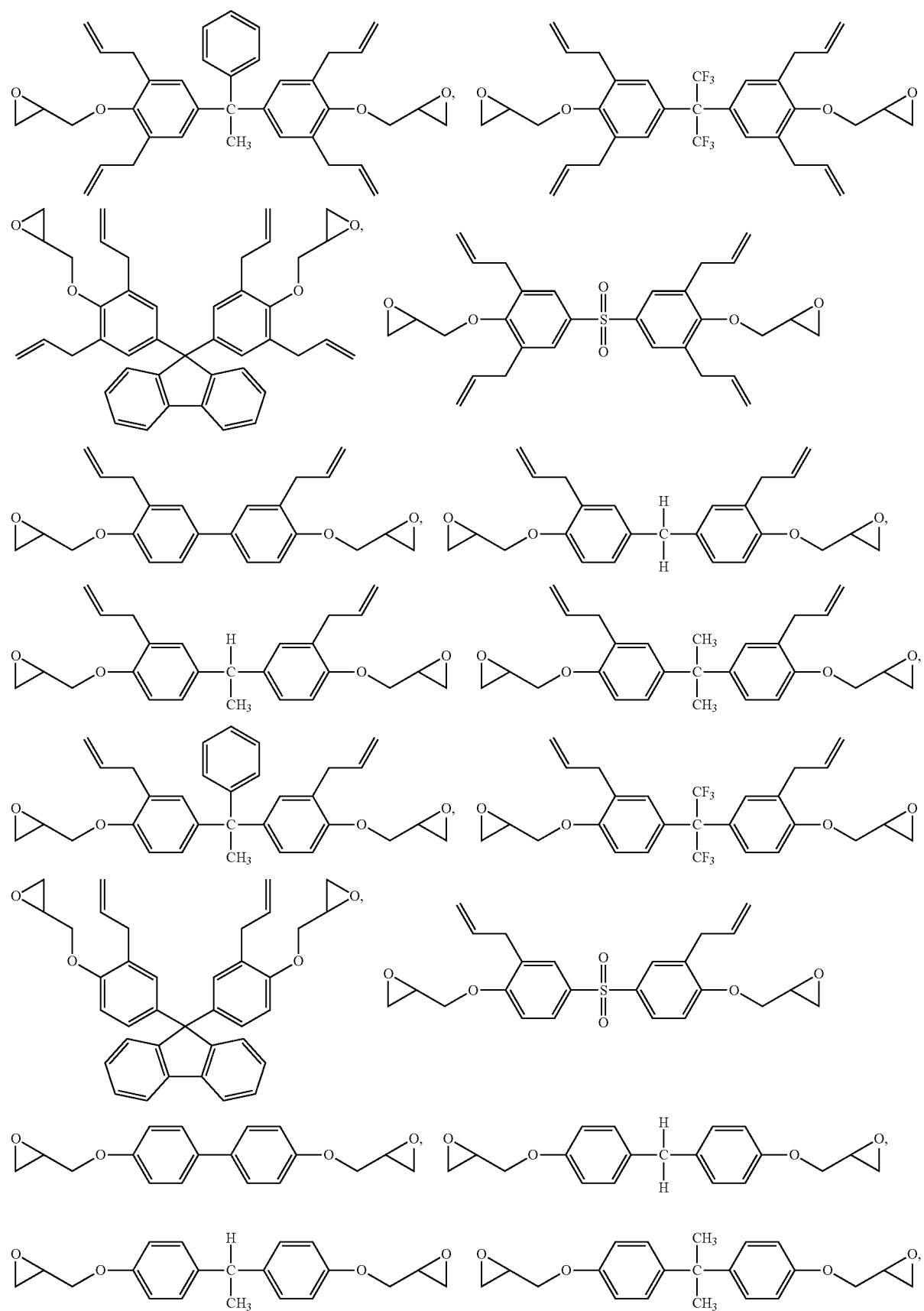

-continued
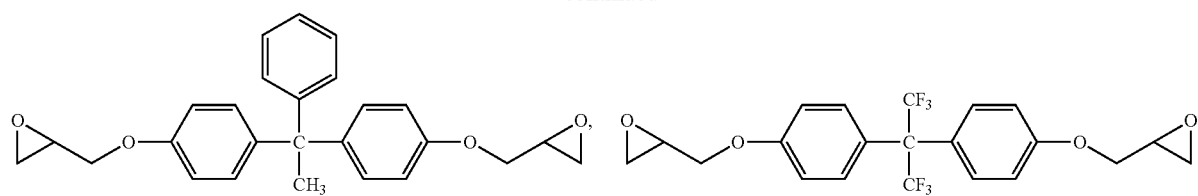
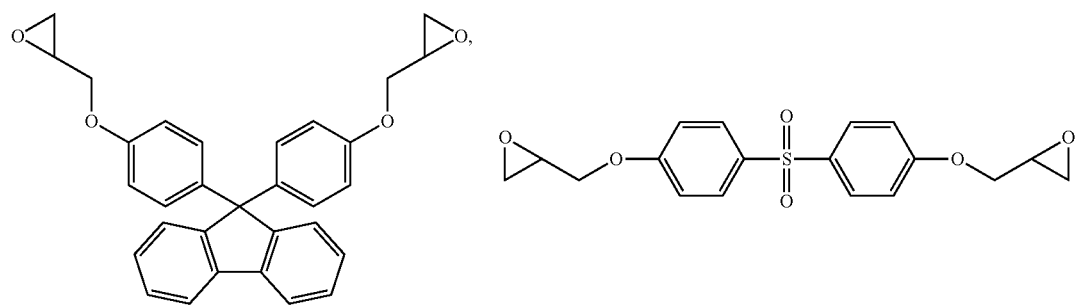
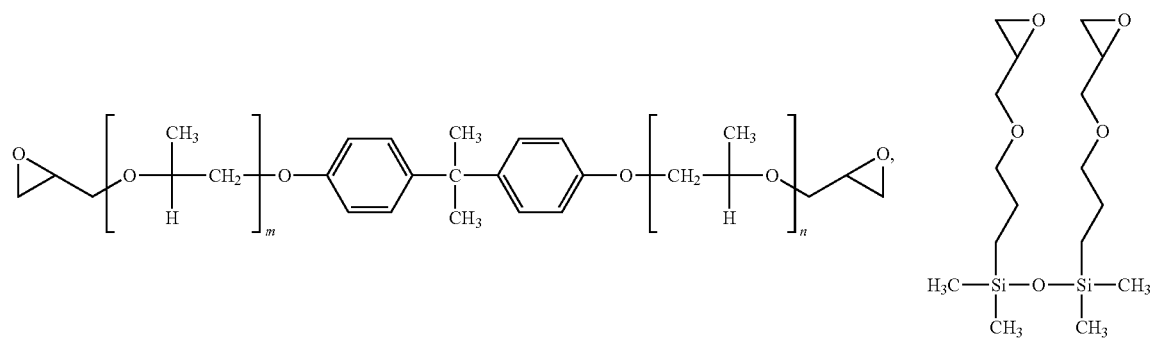
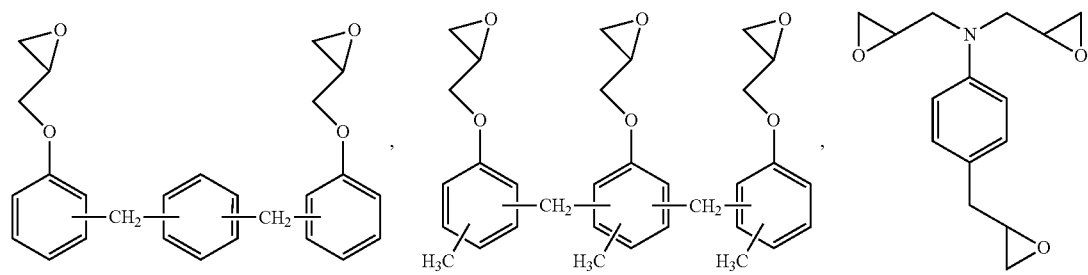
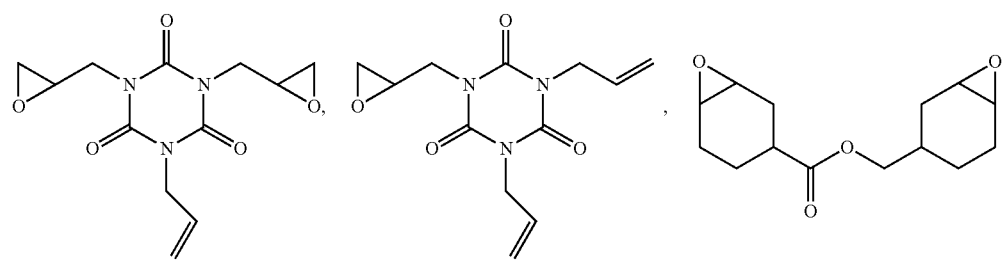

[Component F]

In order to impart the wafer protection, furthermore, to improve the heat resistance, the moisture resistance, and the strength to improve reliability of a cured product, the resin composition of the present invention may contain an inorganic filler as the component (F). Examples of the inorganic filler include: oxides such as titanium oxide, alumina, fused silica (fused spherical silica, fused crushed silica), and powder of crystalline silica; silicates such as talc, glass, calcined clay; nitrides such as aluminum nitride, boron nitride, and silicon nitride; carbonates such as calcium carbonate and magnesium carbonate; hydroxides such as aluminum hydroxide, magnesium hydroxide and calcium hydroxide; sulfates or sulfites such as barium sulfate, calcium sulfate, and calcium sulfite. These inorganic fillers may be used singularly or in a combination of two or more kinds.

An average particle size of the inorganic filler is not particularly limited but is preferably 0.01 to 30 μm, and more preferably 0.03 to 14 μm. When the average particle size of the inorganic filler is 0.01 μm or larger, the filler may be readily filled, furthermore, the strength of the cured product tends to be higher, and, when the average particle size is 30 μm or smaller, the filling between the chips becomes excellent.

Among these, silica powder such as the fused silica and crystalline silica are preferable. A content of the component (F) is preferably 14 to 96 mass %, more preferably 20 to 96 mass %, still more preferably 50 to 95 mass %, and particularly preferably 60 to 93 mass % in the solid content of the resin composition. When the content of the inorganic filler is 96 mass % or smaller, the filling property of the inorganic filler and processability of the composition become more excellent, and when the content is 14 mass % or larger, preferably 20 mass % or larger, the effect of the inorganic filler is fully exhibited. Incidentally, the solid content means a component other than an organic solvent.

[Other Components]

Furthermore, the resin composition of the present invention may further contain components other than ones described above. For example, an organic solvent, a flame retardant agent, an antioxidant, a pigment, and a dye may be used.

(Organic Solvent)

The resin composition of the present invention may be used by dissolving in an organic solvent to uniformly mix these components. Examples of the organic solvents include: N,N-dimethylacetamide, methyl ethyl ketone, N,N-dimethylformamide, cyclohexanone, cyclopentanone, N-methyl-2-pyrrolidone, methanol, ethanol, isopropanol, acetone, propylene glycol monomethyl ether, propylene glycol monomethyl ether acetate, toluene, and xylene, in particular, methyl ethyl ketone, cyclopentanone, propylene glycol monomethyl ether, and propylene glycol monomethyl ether acetate are preferred, but are not limited to these. These organic solvents may be used singularly or in a combination of two or more kinds. As an amount used of the organic solvent, an amount by which a solid content concentration in the resin composition becomes 40 to 90 mass % is preferable.

(Flame Retardant Agent)

The resin composition of the present invention may contain a flame retardant agent to improve the flame retardancy. As the flame retardant agent, a phosphorus-based flame retardant agent is cited, and this imparts the flame retardancy without containing a halogen atom. Examples of these include a phosphazene compound, a phosphate ester compound and a phosphate ester amide compound. Since the phosphazene compound and the phosphate ester amide compound contain a phosphorus atom and a nitrogen atom within a molecule, particularly high flame retardancy is obtained. A content of the flame retardant agent is preferably 3 to 40 parts by mass relative to 100 parts by mass of the component (A).

Other than the above, various kinds of additives may be appropriately added to improve various characteristics such as an improvement in compatibility of each component, the storage stability of the resin composition or the workability. For example, an internal mold release agent such as a fatty acid ester, glyceric acid ester, zinc stearate, and calcium stearate, and a phenol-based, a phosphorus-based or a sulfur-based antioxidant may be added. Furthermore, the composition may be colored with a pigment such as carbon black.

The composition of the present invention can collectively mold the wafer (wafer molding), has excellent moldability in particular to a large diameter and thin film wafer, and simultaneously has high adhesiveness and low warpage difficult to cause peeling from a substrate, can excellently perform the molding process, and can be suitably used to perform wafer-level packaging.

[Resin Film]

Furthermore, in the present invention, a resin film made into a film form from the resin composition of the present invention is provided. The resin film of the present invention is obtained by processing the resin composition into a film. By forming into a film form, one having excellent moldability to a large diameter and thin film wafer is obtained, and since when collectively molding the wafer, there is no need of flowing the resin, a problem of filling defect to a wafer surface is not caused. Furthermore, since the resin film formed by using the resin composition is difficult to cause warpage and has high adhesive force, a wafer molded material difficult to cause various errors is obtained.

The resin film of the present invention may be one in which a protective film is laminated on the resin film obtained from the resin composition. One example of a method for producing the resin film of the present invention in this case will be described.

The component (A), (B), (C), (D), and as needs arise, the component (F), the epoxy compound (E) other than the component (A), and other components are mixed to prepare a resin composition solution, the resin composition solution is applied on a protective film so as to be a desired thickness with a reverse roll coater or a comma coater. The protective film applied with the resin composition solution is passed through an inline dryer to remove an organic solvent at 80 to 160° C. for 2 to 20 minutes to dry, followed by compressing and laminating with a separate protective film using a roll laminator to be able to obtain a laminate film in which a resin film is formed. When the laminate film is used as a wafer mold material, excellent moldability is provided.

When the resin composition of the present invention is formed into a film shape, there is no restriction on the thickness but the thickness is preferably 2 mm or smaller, more preferably 50 μm or thicker and 1,200 μm or thinner, and further preferably 80 to 850 μm. The thickness like this is preferable because of being excellent in the protectiveness as a semiconductor sealing agent.

The protective film is not particularly restricted as long as it can be peeled without damaging a shape of the resin film made of the resin composition of the present invention, but functions as a protective film and a peel film for a wafer, and usually plastic films such as a polyethylene (PE) film, a polypropylene (PP) film, a polymethylpentene (TPX) film, and a polyester film provided with a mold release treatment are used. Furthermore, the peeling force is preferably 50 to 300 mN/min. A thickness of the protective film is preferably 25 to 150 μm, and more preferably 38 to 125 μm.

[Semiconductor Laminate and its Production Method]

A semiconductor laminate of the present invention has a cured product of the resin film of the present invention on a semiconductor wafer. A method for producing the semiconductor laminate of the present invention is a method having a step of adhering the resin film on a semiconductor wafer to mold the semiconductor wafer, and a step of heating and curing the resin film.

The semiconductor wafer may be a wafer on a surface of which a semiconductor element (chip) is mounted, or a semiconductor wafer on a surface of which a semiconductor element is prepared. The resin film of the present invention has excellent filling property to a wafer surface like this before molding, further has high strength and high adhesiveness after molding, and has excellent protectiveness of the wafer like this. Furthermore, the resin film of the present invention may be preferably used to mold a thin film wafer or a large diameter wafer of a diameter of 8 inch or larger, for example, a diameter of 8 inch (200 mm), 12 inch (300 mm) or more. As the thin film type wafer, a wafer thinly processed to a thickness of 5 to 400 μm is preferable.

Incidentally, a semiconductor laminate having a cured product of a resin film of the present invention on a square substrate may be also obtained with the resin film of the present invention.

The square substrate may be mounted with a semiconductor element (chip) on a surface or may be prepared with a semiconductor element on a surface. The resin film of the present invention may be suitably used as a mold material, neither depending on a substrate size of 10 cm square or 50 cm square, a furthermore larger substrate, a rectangular shape or a trapezoidal shape, nor depending on a thickness of the substrate.

Although a molding method of a wafer in which the resin film of the present invention is used is not particularly limited, the method is performed, for example, by peeling one protective film adhered on the resin film, with a vacuum laminator manufactured by Takatori Corporation (Product name: TEAM-300), by setting the inside of a vacuum chamber to a degree of vacuum of 50 to 1,000 Pa, preferably 50 to 500 Pa, for example, at 100 Pa, and, at 80 to 200° C., preferably at 80 to 130° C., for example at 100° C., by collectively bringing the resin film on which the other protective film is adhered into close contact with the wafer, and after returning to a normal pressure, by cooling the wafer to room temperature and by taking out from the vacuum laminator, followed by peeling the other protective film.

Furthermore, to the wafer on which the semiconductor chip is mounted, a compression mold device or a device provided with a vacuum diaphragm laminator and a metal plate press for flattening may be suitably used. For example, as the compression molding device, a device manufactured by APIC YAMADA COOPORATION (Product name: MZ-824-01) may be used, and when a 300 mm silicon wafer on which semiconductor chips are mounted is molded, molding at 100 to 180° C., molding pressure of 100 to 300 kN, a clamp time of 30 to 90 seconds, and a molding time of 5 to 20 minute is possible.

Furthermore, as the device provided with the vacuum diaphragm laminator and the metal plate press for flattening, a device manufactured by Nichigo-Morton Co., Ltd. (Product name: CVP-300) may be used, and after lamination under the condition of a lamination temperature of 100 to 180° C., a degree of vacuum of 50 to 500 Pa, the pressure of 0.1 to 0.9 MPa, and a lamination time of 30 to 300 seconds, a resin molded surface may be flattened under temperatures of upper and lower hot plates of 100 to 180° C., the pressure of 0.1 to 3.0 MPa, and a pressurizing time of 30 to 300 seconds.

After molding, by heating the resin film under the condition of 120 to 220° C. for 15 to 360 minutes, the resin film may be cured. Thus, a semiconductor laminate is obtained.

Since the semiconductor laminate like this has high strength and adhesive force of the resin film, the semiconductor wafer is sufficiently protected with the resin film.

Furthermore, a method for producing the semiconductor laminate like this may produce a semiconductor laminate in which the semiconductor wafer is sufficiently protected with the resin film.

[Semiconductor Device and Production Method Thereof]

Semiconductor devices of the present invention are obtained by dicing the semiconductor laminate of the present invention into individual chips. A method for producing the semiconductor devices of the present invention is a method comprising a step of dicing the semiconductor laminate produced according to the production method of the semiconductor laminate of the present invention into individual chips. Thus, by dicing the semiconductor wafer molded with the resin film into individual chips, semiconductor devices having a heat-cured coating film are obtained. A molded wafer is adhered such that a molded resin surface or a wafer surface contact with a semiconductor processing protective tape such as a dicing tape, followed by providing on a suction table of a dicer, and the molded wafer is diced by using a dicing saw (for example, DFD6361 manufactured by DISCO Corporation) provided with a dicing blade. Although a spindle speed and a cutting speed during dicing may be appropriately selected, usually, the spindle speed is 25,000 to 45,000 rpm, and the cutting speed is 10 to 50 mm/second. Furthermore, although a size to be diced depends on design of the semiconductor package, it may be about 2 mm×2 mm to 30 mm×30 mm.

Thus, since the semiconductor wafer molded with the resin film has high strength and adhesive force of the resin film, the semiconductor wafer is sufficiently protected, and by dicing this into individual chips, high quality semiconductor devices may be produced with a high yield.

EXAMPLES

In what follows, the present invention will be more specifically described with reference to synthesis examples, examples, and comparative examples. However, the present invention is not limited to the following examples.

Compounds S-1 to S-6 used are as shown below.

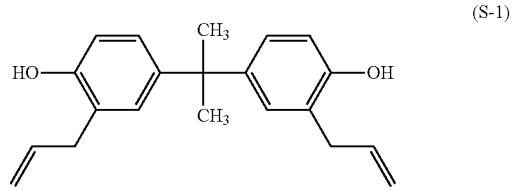
(S-1)

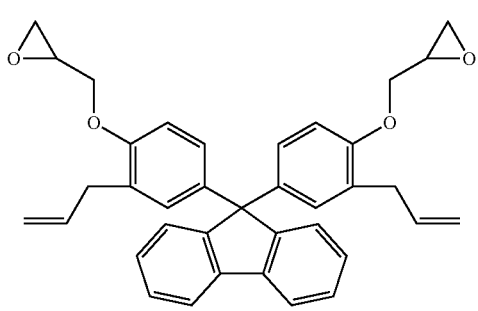
(S-2)

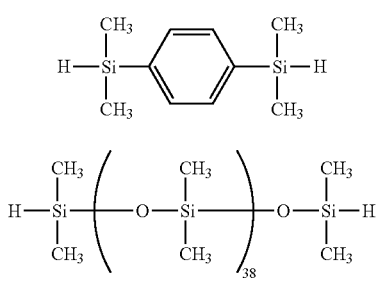
(S-3)

(S-4)

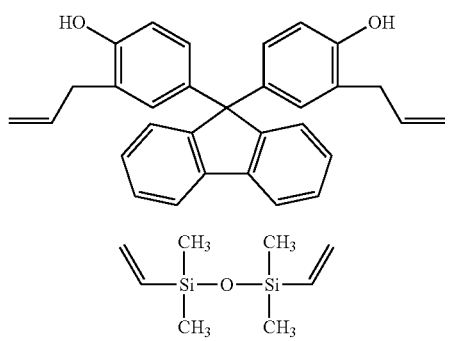
(S-5)

(S-6)

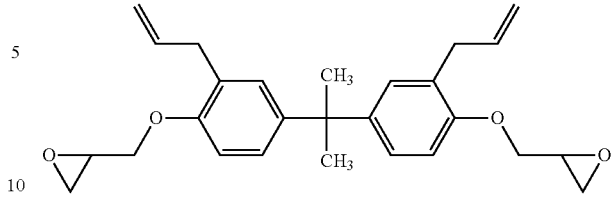
(S-7)

(1) Synthesis of Resin

A resin (an epoxy resin) of the component (A) was synthesized as shown below.

In a synthesis example, the weight average molecular weight (Mw) is a value measured by a gel permeation chromatography (GPC) with a monodispersed polystyrene as a standard, under an analysis condition of a flow rate of 0.6 mL/minute, an elution solvent of tetrahydrofuran, and a column temperature of 40° C., with GPC column TSKgel Super HZM-H (manufactured by Tosoh Corporation).

(Resin Synthesis Example 1)

In a 3 L flask provided with a stirrer, a thermometer, a nitrogen substitution device and a reflux cooler, after 420.5 g (1.000 mole) of the compound S-7 was charged, 1,400 g of toluene was added, followed by heating to 70° C. After that, 1.0 g of a toluene solution of chloroplatinic acid (platinum concentration: 0.5 mass %) was charged and 194.4 g (1.000 mole) of the compound S-3 was dropped over 1 hour ([total number of moles of hydrosilyl groups]/[total number of moles of alkenyl groups]=1.000/1.000=1.00). After completion of dropping, preformed aging for 6 hours by heating to 100° C., the toluene was vacuum distilled from a reaction solution, and 570 g of the epoxy resin 1 was obtained. The Mw of the epoxy resin 1 was 53,200. An epoxy equivalent is 307 g/eq. (Measurement of epoxy equivalent: JIS K 7236)

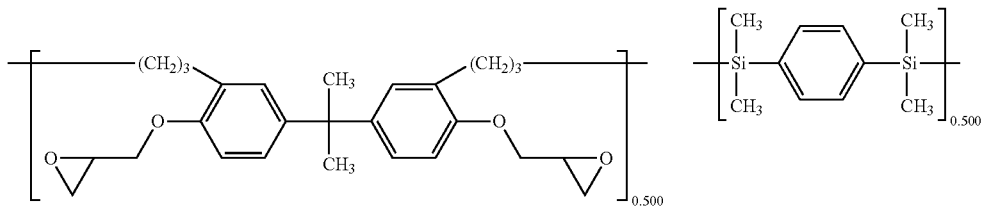

(Synthesis Example of Epoxy Compound (S-7))

In a 5 L flask provided with a stirrer, a thermometer, a nitrogen substitution device and a reflux cooler, 617 g of a compound S-1 (2.0 mole), 256 g of methanol (8.0 mole), and 852 g of epichlorohydrin (8.0 mole) were charged, 768 g of sodium hydroxide (19.2 mole) was added over two hours, followed by reacting for 3 hours by raising the temperature to 60° C. After the reaction, 500 mL of toluene was added, after washing an aqueous phase with pure water to be neutral, a solvent in an organic layer was removed under reduced pressure, and 757 g (1.8 mole) of an epoxy compound (S-7) was obtained.

(Synthesis Example of Resin 2)

In a 3 L flask provided with a stirrer, a thermometer, a nitrogen substitution device and a reflux cooler, after 133.5 g (0.227 mole) of the compound S-2 was charged, 1,500 g of toluene was added, followed by heating to 70° C. After that, 1.0 g of a toluene solution of chloroplatinic acid (platinum concentration: 0.5 mass %) was charged, 525.6 g (0.182 mole) of the compound S-4 and 8.8 g (0.045 mole) of the compound S-3 were respectively dropped over 1 hour ([total number of moles of hydrosilyl groups]/[total number of moles of alkenyl groups]=0.500/0.500=1). After completion of dropping, preformed aging for 6 hours by heating to 100° C., the toluene was vacuum distilled from a reaction solution, and 605 g of the epoxy resin 2 expressed by the following formula was obtained. The Mw of the epoxy resin 2 was 51,100. An epoxy equivalent is 1471 g/eq.

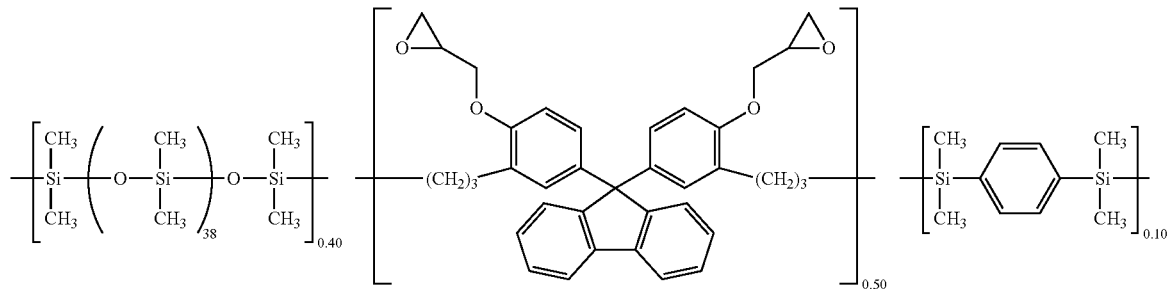

(Synthesis Example of Resin 3)

In a 3 L flask provided with a stirrer, a thermometer, a nitrogen substitution device and a reflux cooler, after 104.9 g (0.179 mole) of the compound S-2, and 61.5 g (0.143 mole) of the compound S-5, and 6.6 g (0.036 mole) of the compound S-6 were added, 1,600 g of toluene was added, followed by heating to 70° C. After that, 1.0 g of a toluene solution of chloroplatinic acid (platinum concentration: 0.5 mass %) was charged, 516.3 g (0.179 mole) of the compound S-4, and 34.7 g (0.179 mole) of the compound S-3 were dropped respectively over 1 hour ([total number of moles of hydrosilyl groups]/[total number of moles of alkenyl groups]=0.500/0.500=1.00). After completion of dropping, preformed aging for 6 hours by heating to 100° C., the toluene was vacuum distilled from a reaction solution, and 680 g of the epoxy resin 3 was obtained. The Mw of the epoxy resin 3 was 46,800. An epoxy equivalent is 2022 g/eq.

(2) Preparation of Resin Film

Examples 1 to 21 and Comparative Examples 1 to 7

According to compositions of Examples 1 to 21 and Comparative Examples 1 to 7 described in the following Tables 1 to 2, (A) an epoxy resin, (B) a phenolic curing agent, (C) a curing accelerator, (D) an adhesive aide, (E) an epoxy compound, and (F) an inorganic filler were blended respectively. Furthermore, cyclopentanone of an amount of which solid content concentration becomes 80 mass % was added, followed by stirring with a stirrer to mix and disperse, thus, a dispersion of the resin composition was prepared. So as to make equivalents of the epoxy groups and phenol groups equal, a phenolic curing agent was added.

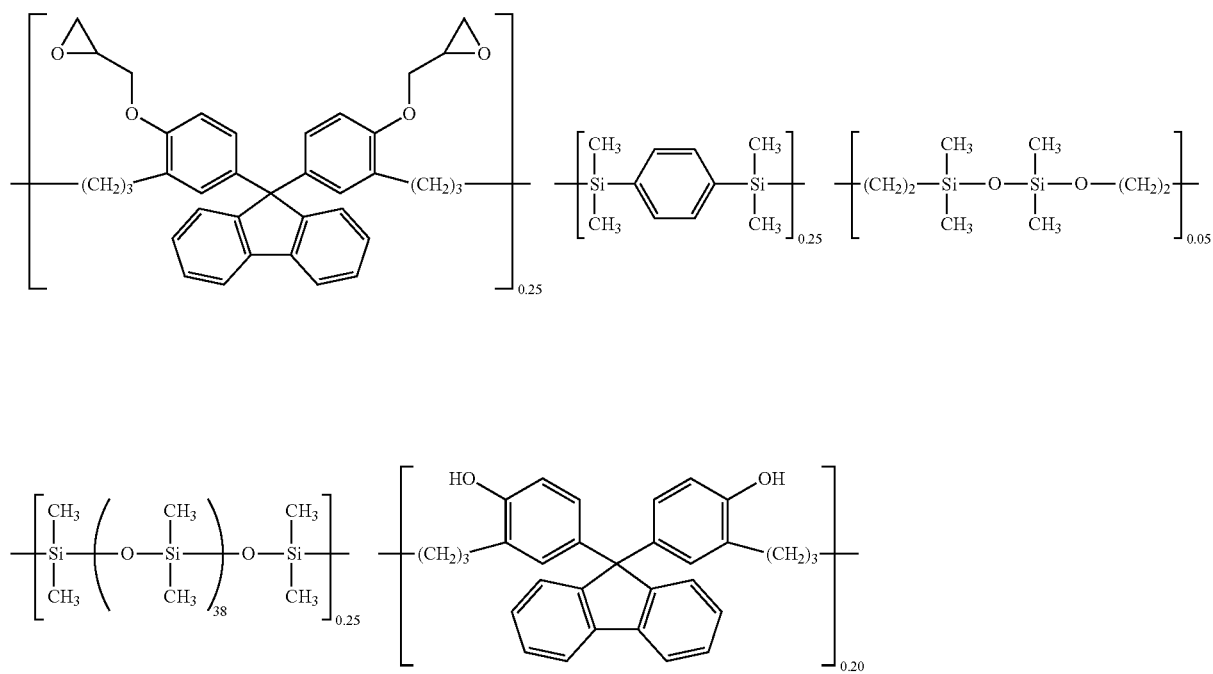

A die coater was used as a film coater, by using E7304 (Product name, Polyester manufactured by Toyobo Co., Ltd., thickness: 75 μm, peel force: 200 mN/50 mm) as a base film, each of the resin compositions was applied on the base film. Subsequently, the solvent was completely vaporized by charging into an oven set at 100° C. for 20 minutes, and a resin film having a film thickness of 100 μm was formed on the base film.

The respective components used in preparation of the resin composition other than the above are shown below.

Component (A): Epoxy Resin

YL983U (epoxy equivalent 172 g/eq; manufactured by Mitsubishi Chemical Corporation)

Component (B): Phenolic Curing Agent

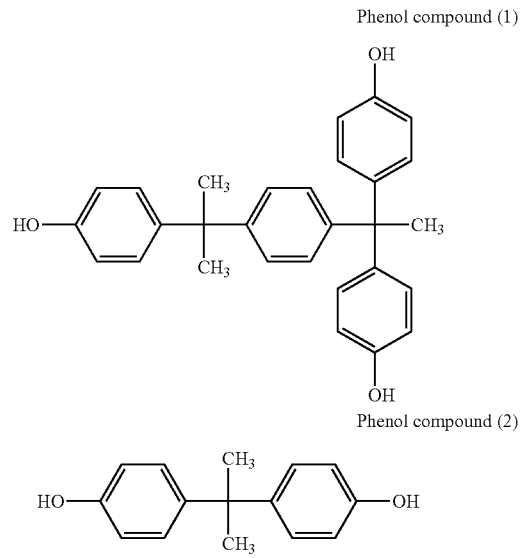

Phenol compound (1)

Phenol compound (2)

Component (C): Curing accelerator

Curezol 2P4MHZ (manufactured by Shikoku Chemical Corporation, 2-phenyl-4-methyl-5-hydroxymethylimidazole)

Component (D): Adhesive aide

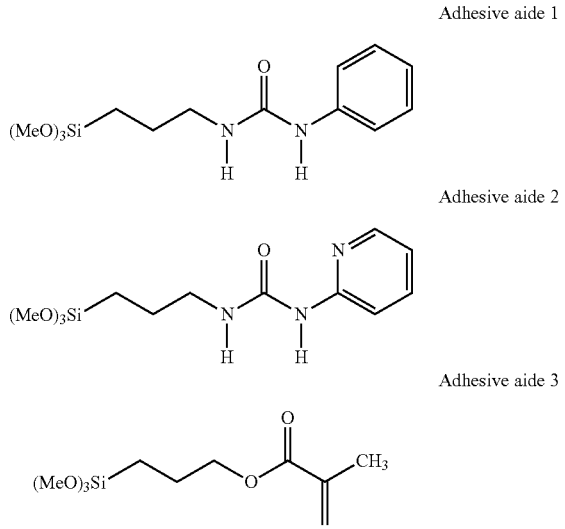

Adhesive aide 1

Adhesive aide 2

Adhesive aide 3

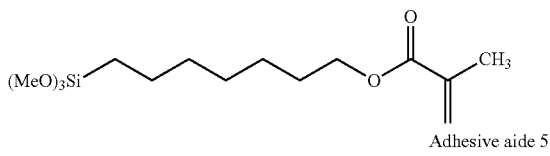

Adhesive aide 4

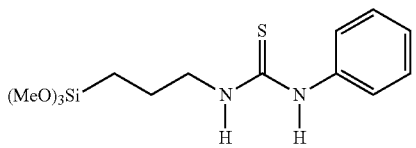

Adhesive aide 5

Component (E): Epoxy Compound

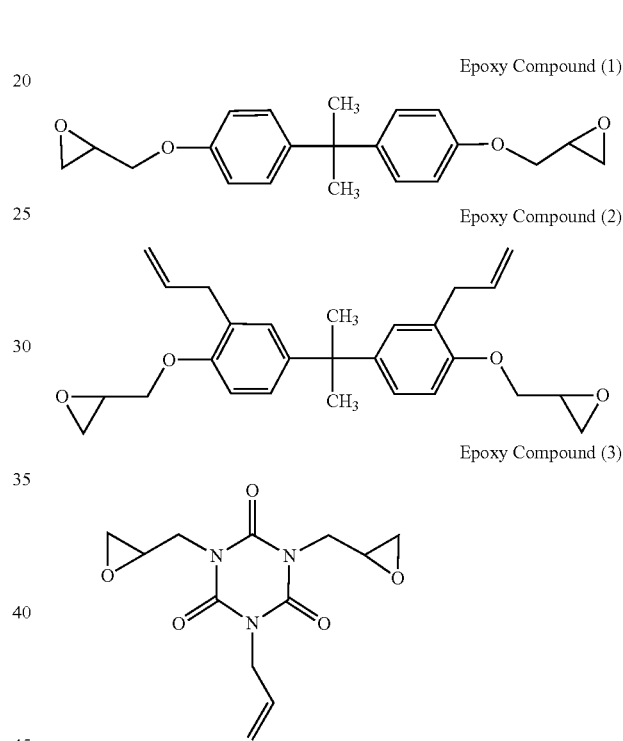

Epoxy Compound (1)

Epoxy Compound (2)

Epoxy Compound (3)

Component (F): Inorganic Filler

Silica 1 (manufactured by Admatechs, average particle size: 5.0 μm)

Silica 2 (manufactured by Admatechs, average particle size: 10.0 μm)

(3) Evaluation of resin film

The obtained resin films were evaluated according to the following methods. Results are shown in Tables 1 to 2.

(Adhesion Test Method)

A prepared film was adhered to a 20 mm square silicon wafer, from the above, a silicon chip cut into 2 mm square was pressed down, these were cured by heating at 180° C. for 4 hours, after that, with an adhesive force measurement device (Universal Bond Tester Series 4000 (DS-100) manufactured by Nordoson Advanced Technology), an adhesive force when the chip is laterally repelled was measured (die share test).

(Test Method of Warpage Stress Measurement)

A prepared film was laminated on the silicon wafer with a film laminator (Product name: TEAM-100, manufactured by Takatori Corporation), and cured by heating at 180° C.

for 4 hours, and these were subjected to warpage stress measurement with a thin film stress measurement device (FLX-2320-S) manufactured by Toho Technology Corporation.

(Reliability Test Method)

A 10 mm square silicon chip with a thickness of 400 μm was mounted on a silicon wafer with an epoxy type adhesive (SINR-DF3770: manufactured by Shin-Etsu Chemical Co., Ltd.), and the adhesive was heated and cured at 190° C. for 2 hours. After that, the prepared film was laminated on the silicon wafer with the film laminator (Product name: TEAM-100, manufactured by Takatori Corporation), followed by heating and curing at 180° C. for 4 hours, further followed by dicing into squares with one side of 3 cm, with the chip at the center. These were charged into a thermal shock tester manufactured by ESPEC Corp, subjected to a thermal shock test of −55° C. to 125° C. and 1000 cycles, followed by confirming a state of an interface between the chip and mold by cross-sectional observation. When there is peeling or crack, it was determined to be poor, and there is no problem, it was determined to be excellent.

Examples are shown in Table 1 and Comparative Examples are shown in Table 2.

TABLE 1

| | Example | | | | | | | | | | |
|---|---|---|---|---|---|---|---|---|---|---|---|
| | 1 | 2 | 3 | 4 | 5 | 6 | 7 | 8 | 9 | 10 | 11 |
| YL983U | 100 | | | | | | | | | | |
| Epoxy resin 1 | | 100 | | | 100 | 100 | 100 | 100 | | | |
| Epoxy resin 2 | | | 100 | | | | | | 100 | 100 | 100 |
| Epoxy resin 3 | | | | 100 | | | | | | | |
| Phenolic curing agent 1 | 82.3 | 46 | 9.6 | 1.3 | 46 | 46 | 46 | 46 | 9.6 | 9.6 | 9.6 |
| Phenolic curing agent 2 | | | | | | | | | | | |
| Curing accelerator | 2 | 2 | 2 | 2 | 2 | 2 | 2 | 2 | 2 | 2 | 2 |
| Epoxy compound 1 | | | | | | | | | | | |
| Epoxy compound 2 | | | | | | | | | | | |
| Epoxy compound 3 | | | | | | | | | | | |
| Silica 1 | 755 | 608 | 467 | 433 | 608 | 608 | 608 | 608 | 467 | 467 | 467 |
| Silica 2 | | | | | | | | | | | |
| Adhesive aide 1 | 5 | 5 | 5 | 5 | | | | | | | |
| Adhesive aide 2 | | | | | 5 | | | | 5 | | |
| Adhesive aide 3 | | | | | | 5 | | | | 5 | |
| Adhesive aide 4 | | | | | | | 5 | | | | 5 |
| Adhesive aide 5 | | | | | | | | 5 | | | |
| Adhesion test (MPa) | 30 | 28 | 29 | 28 | 26 | 28 | 25 | 28 | 20 | 21 | 20 |
| Warpage stress (MPa) | 6.1 | 5.2 | 3.9 | 4.7 | 5.2 | 5.1 | 5.1 | 5.4 | 3.8 | 4.2 | 4.5 |
| Reliability test | excellent | excellent | excellent | excellent | excellent | excellent | excellent | excellent | excellent | excellent | excellent |

| | Example | | | | | | | | | |
|---|---|---|---|---|---|---|---|---|---|---|
| | 12 | 13 | 14 | 15 | 16 | 17 | 18 | 19 | 20 | 21 |
| YL983U | | | | | | | | | | |
| Epoxy resin 1 | | | | | | | | | | |
| Epoxy resin 2 | 100 | 100 | 100 | 100 | | | | | | |
| Epoxy resin 3 | | | | | 100 | 100 | 100 | 100 | 100 | 100 |
| Phenolic curing agent 1 | 9.6 | 9.6 | 9.6 | 9.6 | 9.7 | 8.1 | 11.5 | | | |
| Phenolic curing agent 2 | | | | | | | | 7.8 | 13.3 | 7.8 |
| Curing accelerator | 2 | 2 | 2 | 2 | 2 | 2 | 2 | 2 | 2 | 2 |
| Epoxy compound 1 | | | | | 10 | | | 10 | 10 | 10 |
| Epoxy compound 2 | | | | | | 10 | | | 10 | |
| Epoxy compound 3 | | | | | | | 10 | | | |

TABLE 1-continued

| | | | | | | | | | | |
|---|---|---|---|---|---|---|---|---|---|---|
| Silica 1 | 467 | 467 | 467 | 467 | 509 | 501 | 514 | 497 | 563 | |
| Silica 2 | | | | | | | | | | 500 |
| Adhesive aide 1 | | | | | 5 | 5 | 5 | 5 | 5 | 5 |
| Adhesive aide 2 | | 2 | 10 | 15 | | | | | | |
| Adhesive aide 3 | | | | | | | | | | |
| Adhesive aide 4 | | | | | | | | | | |
| Adhesive aide 5 | 5 | | | | | | | | | |
| Adhesion test (MPa) | 22 | 17 | 24 | 26 | 30 | 28 | 26 | 28 | 33 | 26 |
| Warpage stress (MPa) | 4.3 | 3.8 | 3.9 | 4.2 | 4.8 | 5.0 | 4.7 | 4.8 | 5.8 | 5.3 |
| Reliability test | excellent | excellent | excellent | excellent | excellent | excellent | excellent | excellent | excellent | excellent |

TABLE 2

| | Comparative Example | | | | | | |
|---|---|---|---|---|---|---|---|
| | 1 | 2 | 3 | 4 | 5 | 6 | 7 |
| YL983U | | | | | | 100 | |
| Epoxy resin 1 | | | | | | | 100 |
| Epoxy resin 2 | 100 | | | | | | |
| Epoxy resin 3 | | 100 | 100 | 100 | 100 | | |
| Phenolic curing agent 1 | 9.6 | 1.3 | 9.7 | 8.1 | 11.5 | | |
| Phenolic curing agent 2 | | | | | | 66.4 | 37.1 |
| Curing accelerator | 2 | 2 | 2 | 2 | 2 | 2 | 2 |
| Epoxy compound 1 | | 10 | | | | | |
| Epoxy compound 2 | | | 10 | | | | |
| Epoxy compound 3 | | | | 10 | | | |
| Silica 1 | 467 | 433 | 509 | 501 | 514 | | |
| Silica 2 | | | | | | 692 | 578 |
| Adhesive aide 1 | | | | | | | |
| Adhesive aide 2 | | | | | | | |
| Adhesive aide 3 | | | | | | | |
| Adhesive aide 4 | | | | | | | |
| Adhesive aide 5 | | | | | | | |
| Adhesion test (MPa) | 11 | 12 | 12 | 13 | 15 | 15 | 14 |
| Warpage stress (MPa) | 3.8 | 4.5 | 4.7 | 4.9 | 4.6 | 5.4 | 4.6 |
| Reliability test | poor | poor | poor | poor | poor | poor | poor |

As the result of what was described above, the resin films obtained from the resin compositions (Examples 1 to 21) of the present invention showed that, in comparison with the resin films obtained from the compositions that do not contain the component (D) (Comparative Examples 1 to 7), the adhesive force was improved and largely contributed in the reliability of the packages. From the characteristics, when the resin compositions of the present invention were used in films for sealing the semiconductor, the peeling is difficult to occur.

Therefore, when the resin composition of the present invention is used, for example, in the use of a film-like mold, excellent low warpage and difficulty to peel property may be exhibited to a chip-mounted wafer.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A resin composition comprising the following (A) to (D):
    (A) a resin containing epoxy groups in the range of 140 to 5000 g/eq as an epoxy equivalent;
    (B) a phenolic curing agent;
    (C) a curing accelerator; and
    (D) at least one compound selected among what is expressed by the following formulae (0-1) to (0-3), (0-6) and (0-7)

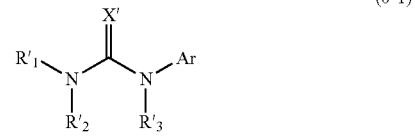

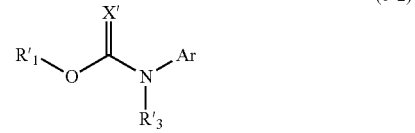

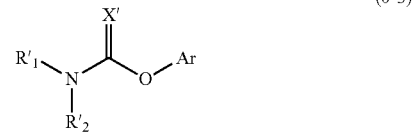

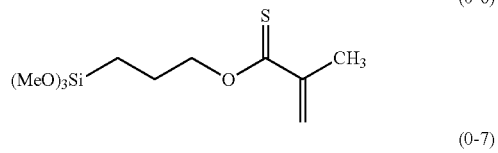

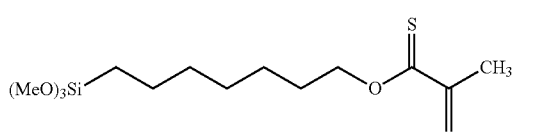

wherein R'$_1$ represents a monovalent organic group having 1 to 20 carbon atoms containing a hydrolyzable silyl group, R'$_2$, R'$_3$ each represents a hydrogen atom or a monovalent organic group having 1 to 20 carbon atoms, X' represents an oxygen atom or a sulfur atom, and Ar represents an aromatic ring or a heterocyclic ring, optionally having two substitution groups.

2. The resin composition according to claim 1, wherein, further comprising 0.1 to 80 parts by mass of (E) an epoxy compound other than the component (A) based on 100 parts by mass of the component (A).

3. The resin composition according to claim 2, further comprising (F) a inorganic filler.

4. The resin composition according to claim 3, wherein the (F) inorganic filler is silica, and is contained by 20 to 96 mass % in the resin composition.

5. The resin composition according to claim 1, further comprising (F) a inorganic filler.

6. The resin composition according to claim 5, wherein the (F) inorganic filler is silica, and is contained by 20 to 96 mass % in the resin composition.

7. The resin composition according to claim 1, wherein X' is an oxygen atom in the compounds expressed by the general formula (0-1) to formula (0-3).

8. The resin composition according to claim 1, wherein the component (A) is a silicone-modified epoxy resin.

9. The resin composition according to claim 8, wherein the silicone-modified epoxy resin contains a structural unit expressed by the following formula (4) and has a weight average molecular weight of 3,000 to 500,000:

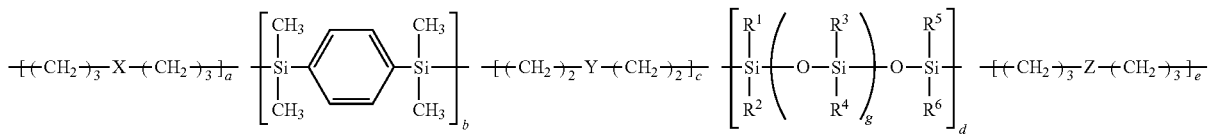

(4)

in the formula, $R^1$ to $R^6$ each is independently a monovalent hydrocarbon group or an alkoxy group having 1 to 20 carbon atoms, and may be the same with or different from each other; furthermore, "a", "b", "c", "d" and "e" express a composition ratio of each of repeating units and are numbers satisfying $0<a<1$, $0\leq b<1$, $0\leq c<1$, $0<d<1$, $0\leq e<1$, $0.67\leq(b+d)/(a+c+e)\leq1.67$, and $a+b+c+d+e=1$; "g" is an integer of 0 to 300; X is a divalent organic group expressed by the following formula (5); Y is a divalent siloxane skeleton-containing group expressed by the following formula (6); Z is a divalent organic group expressed by the following formula (7);

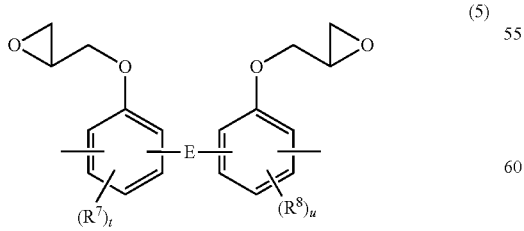

(5)

wherein E is a single bond or a divalent organic group selected from the following formulae,

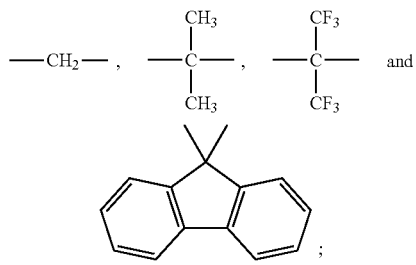

$R^7$ and $R^8$ are a monovalent hydrocarbon group or an alkoxy group having 1 to 20 carbon atoms and may be the same with or different from each other; "t" and "u" each is independently an integer of 0 to 2;

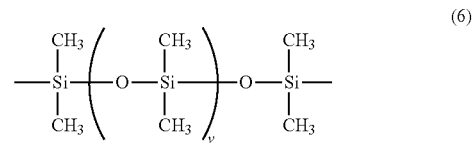

(6)

wherein "v" is an integer of 0 to 300;

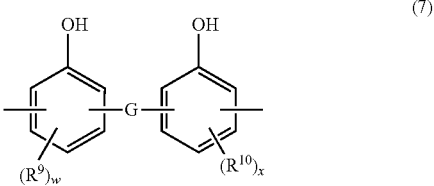

(7)

wherein G is a single bond or a divalent organic group selected from the following formulae,

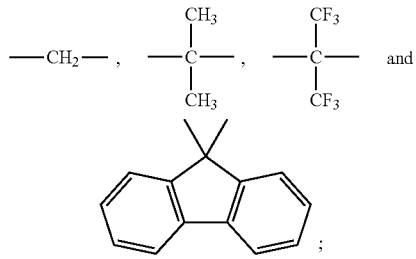

$R^9$ and $R^{10}$ are a monovalent hydrocarbon group or an alkoxy group having 1 to 20 carbon atoms, and may be the same with or different from each other; "w" and "x" each is independently an integer of 0 to 2.

10. A resin film made into a film from the resin composition according to claim 1.

11. A semiconductor laminate having a cured product of the resin film according to claim 10 on a semiconductor wafer.

12. A semiconductor device, wherein the semiconductor laminate according to claim 11 is diced into individual chips.

13. A method for producing a semiconductor laminate comprising:
   a step of adhering the resin film according to claim 10 on a semiconductor wafer and molding the semiconductor wafer; and
   a step of curing the resin film by heating.

14. A method for producing a semiconductor device comprising: a step of dicing the semiconductor laminate produced by the method for producing the semiconductor laminate according to claim 13 into individual chips.

* * * * *